United States Patent [19]

Yamaga et al.

[11] Patent Number: 5,484,484
[45] Date of Patent: Jan. 16, 1996

[54] THERMAL PROCESSING METHOD AND APPARATUS THEREFOR

[75] Inventors: Kenichi Yamaga, Sagamihara; Yuichi Mikata, Kawasaki; Akihito Yamamoto, Kanagawa, all of Japan

[73] Assignees: Tokyo Electron Kabushiki, Japan; Tokyo Electron Kabushiki Kaisha; Kabushiki Kaisha Toshiba, Tokyo, all of Japan

[21] Appl. No.: 269,039

[22] Filed: Jun. 30, 1994

[30] Foreign Application Priority Data

| Jul. 3, 1993 | [JP] | Japan | 5-190862 |
| Jul. 8, 1993 | [JP] | Japan | 5-194256 |
| Jul. 14, 1993 | [JP] | Japan | 5-196851 |
| Dec. 22, 1993 | [JP] | Japan | 5-346436 |
| Dec. 24, 1993 | [JP] | Japan | 5-347784 |
| Dec. 24, 1993 | [JP] | Japan | 5-347785 |

[51] Int. Cl.$^6$ .............................................. C23C 16/00
[52] U.S. Cl. ........................ 118/719; 118/725; 118/715
[58] Field of Search ............................ 118/715, 719, 118/725

[56] References Cited

U.S. PATENT DOCUMENTS

5,016,567  5/1991  Iwabuchi et al. ..................... 118/733

FOREIGN PATENT DOCUMENTS

2-52420  2/1990  Japan .

*Primary Examiner*—Richard Bueker
*Attorney, Agent, or Firm*—Beveridge DeGrandi, Weilacher & Young

[57] ABSTRACT

An $Si_3N_4$ layer is formed on a surface of a wafer, which is an object to be processed, at a high temperature of, for example, 780° C., using a vertical thermal processing apparatus having a reaction tube of a double-wall structure comprising an inner tube and an outer tube in which a predetermined reduced-pressure status is maintained within the reaction tube while a reaction gas comprising, for example, $SiH_2Cl_2$ and $NH_3$ is made to flow from an inner side to an outer side of the inner tube by the action of a first gas supply pipe and first exhaust pipe provided in the thermal processing apparatus. Next, the temperature in the interior of the reaction tube is raised to, for example, 1000° C., a reaction gas comprising, for example, $H_2O$ vapor and HCl is made to flow from the outer side to the inner side of the inner tube by the action of a second gas supply pipe and second exhaust pipe, and an $SiO_2$ layer is formed by the oxidation of the surface of the $Si_3N_4$ layer formed on the surface of the wafer, under normal-pressure conditions. The use of a combined chamber enables the implementation of film formation and either oxidation or diffusion processing without having to remove the object to be processed from the reaction tube, and thus prevents the intrusion of a natural oxide layer or the incorporation of particles into a thin film structure of, for example, $SiO_2$ and $Si_3N_4$ layers used as a multi-layer insulating film for devices such as DRAMs.

4 Claims, 11 Drawing Sheets

F I G. I

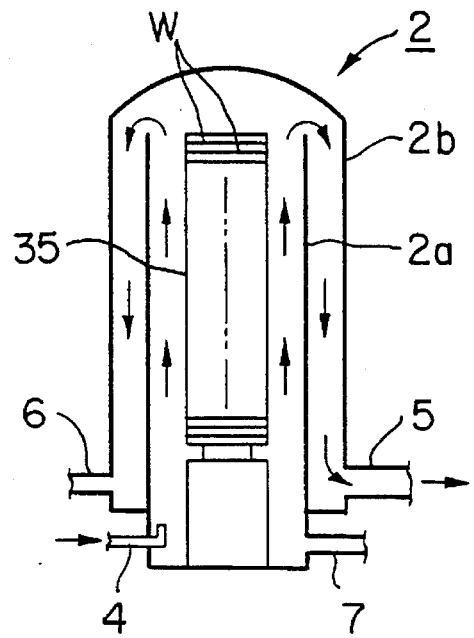
FIG. 3A
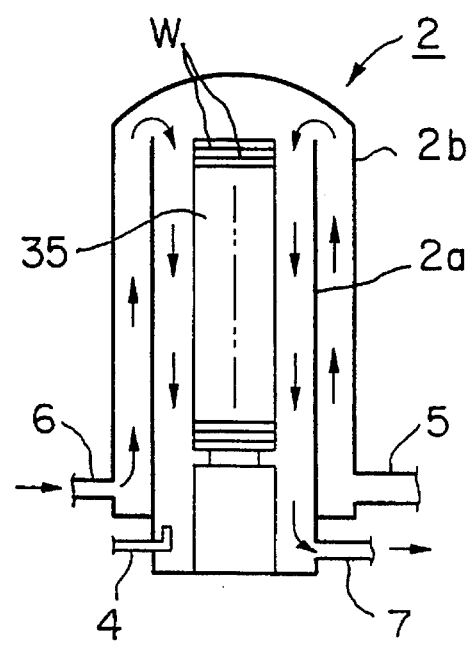
FIG. 3B
FIG. 4A
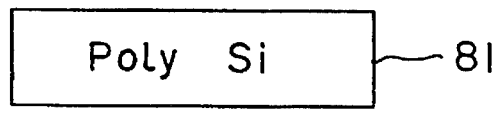
FIG. 4B
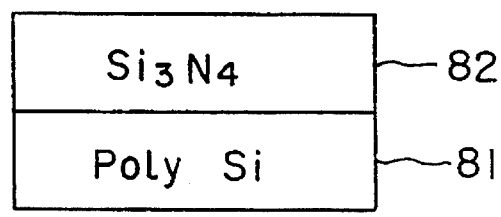
FIG. 4C
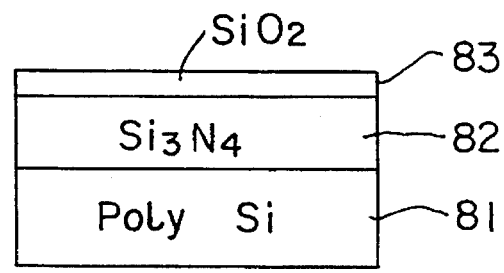

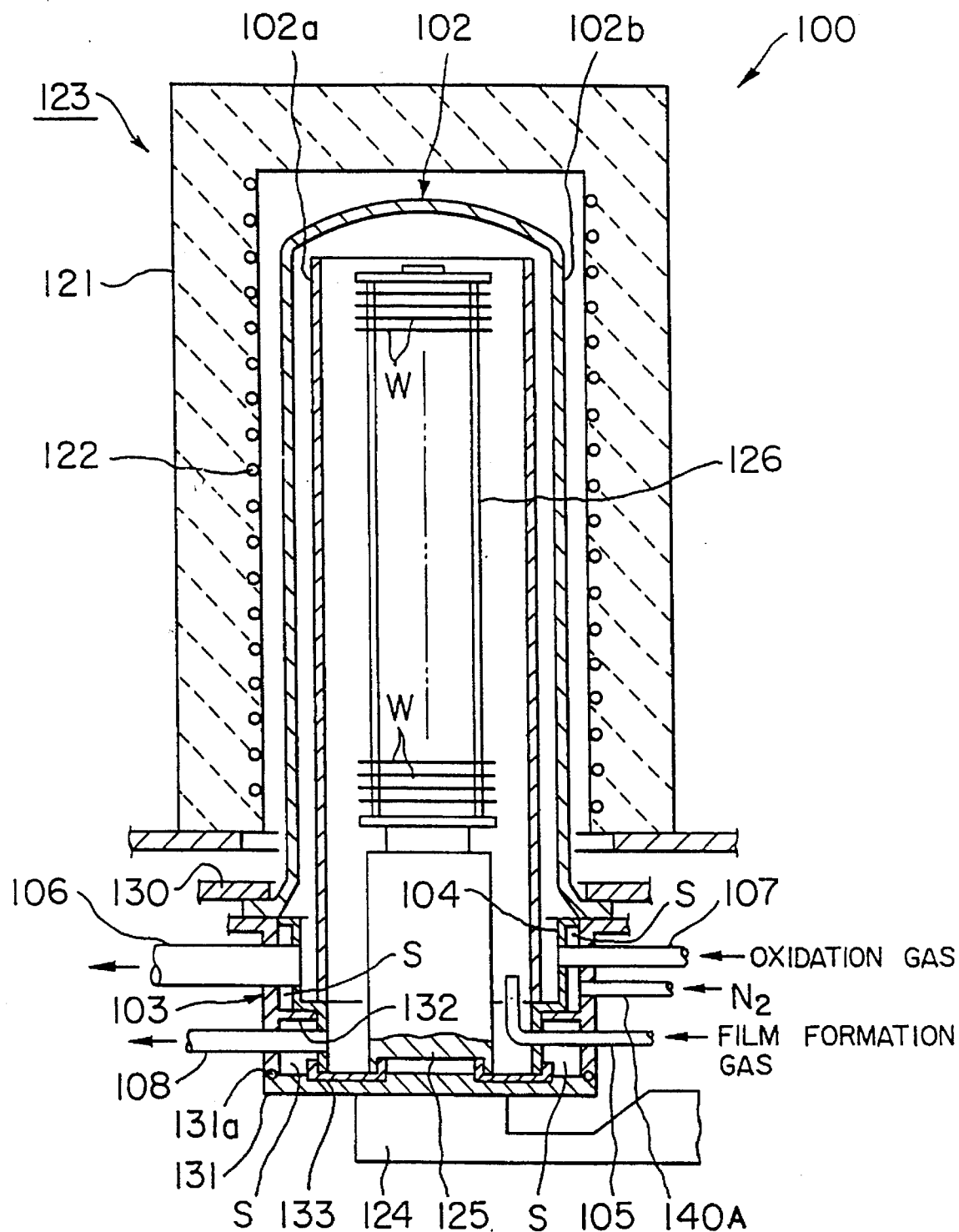
F I G. 5

THERMAL PROCESSING METHOD AND APPARATUS THEREFOR

BACKGROUND OF THE INVENTION

The present invention relates to a thermal processing method and an apparatus therefor.

Semiconductor devices such as DRAM devices are becoming even more closely integrated, and it has become necessary to be resourceful in the structure and fabrication of such devices. For example, multi-layer films of either an $SiO_2/Si_3N_4/SiO_2$ or an $SiO_2/Si_3N_4$ structure are currently being investigated as capacitor insulation layers for DRAMs, in order to reduce the temperature while ensuring the insulating withstand pressure at the corners of trenches.

In order to ensure high levels of reliability for such devices, there are even greater demands for improvements in the quality of thin films because if, for example, oxygen is accidently incorporated into an $Si_3N_4$ layer, the permittivity will drop and long-term reliability will deteriorate. Therefore, when such a multi-layer insulating film is formed, it is appropriate to use a vertical thermal processing apparatus that draws in as little as possible of the outside atmosphere into its thermal processing chamber.

When $SiO_2$ and $Si_3N_4$ layers are formed in the prior art, for example, the steps shown in FIG. 14 are implemented. In other words, the semiconductor wafer (hereinafter abbreviated simply to "wafer") is placed on a holder means (a wafer boat) and conveyed thereon into a reduced-pressure chemical vapor deposition (CVD) chamber at one thermal processing station, and gases such as $SiH_2Cl_2$ and $NH_3$ are used as processing gases to form an $Si_3N_4$ film on the surface of the wafer while the interior of the chamber is held as a predetermined degree of vacuum. The wafer is then conveyed out of the chamber and is removed from the holder means. Next, the wafer is accommodated in a wafer carrier and is conveyed to another thermal processing station, where it is transferred to a holder means and is conveyed into an oxidation chamber, and an $SiO_2$ film is formed on the surface of the wafer under normal pressure by exposure to oxygen or a mixed gas of, for example, oxygen and hydrogen chloride, and then the wafer is conveyed out of the chamber.

However, with the above described processing method, since the wafer with the $Si_3N_4$ film formed thereon has to be conveyed out of the reduced-pressure CVD chamber and into a different thermal processing station, a natural oxide layer will form over the $Si_3N_4$ layer. This is particularly likely to happen after film formation in a reduced-pressure CVD chamber. When a cap at a lower edge of the chamber is opened, it is inevitable that a certain amount of the outer atmosphere will be dragged into the chamber, and thus the surface of the $Si_3N_4$ layer will come into contact with the atmosphere while at a high temperature. This causes a natural oxide layer of an uneven thickness to be formed, and it is extremely difficult to remove this natural oxide layer, even if the wafer is washed before it goes on to the subsequent oxidation step. Similarly, when the wafer is transferred to the holder means under the oxidation chamber, the wafer is exposed to the atmosphere while it is still at a fairly high temperature, and thus the formation of a natural oxide layer is promoted and the desired oxide layer will be formed in the oxidation chamber over the natural oxide layer. This means that there will be an oxide layer of poor quality in the multi-layer insulating film of the wafer, so that the reliability of the device, such as a DRAM, will be low.

With the prior art processing method, the wafer has to be transferred a large number of times while it is conveyed out of the reduced-pressure CVD chamber, conveyed toward the other thermal processing station while accommodated in the carrier, and them conveyed into the oxidation chamber, so that particles can easily adhere thereto. Since it seems likely that the above described multi-layer insulating film will become even thinner as DRAMs become even more densely integrated in the future, the inclusion of even a tiny amount of particles will adversely affect the characteristics of the insulating layer even further. The above problems will also occur with an $Si_3N_4$ layer on an $SiO_2$ layer.

Thus it is difficult to obtain an $SiO_2/Si_3N_4$ or $SiO_2/Si_3N_4/SiO_2$ multi-layer insulating film of a good film quality with a prior art thermal processing method, and this is one reason why the further integration of devices such as DRAMs is impeded.

Another problem with reduced-pressure CVD concerns the use of a manifold made of stainless steel that can be used for several different types of processing. This manifold is corrosion resistant, but corrosion will still be promoted if the processing temperatures increase further when highly corrosive gases are used. This means that there are limitations on the types of gas that can be used at high temperatures.

With the present invention, the inventors propose a vertical thermal processing apparatus that can perform both reduced-pressure CVD and either oxidation or diffusion in a common chamber (see the description herein of the first embodiment). It is possible that hydrochloric acid (HCl) could be mixed into the processing gases used for oxidation. The use of HCl has advantages in that it eliminates any impurities that may be introduced from the outside, and thus ensures a good-quality film, but the presence of any $H_2O$ vapor will result in extremely strong corrosiveness, the inner peripheral surface of the stainless steel manifold will be corroded thereby, and thus contamination of the wafers by particles and heavy metals will occur. Note that forming the manifold of quartz would solve this problem of corrosion, but the manufacture of such a manifold would be difficult and expensive, and it would also be difficult to connect the external piping and intake/exhaust ports.

SUMMARY OF THE INVENTION

The present invention was devised in the light of the above described problems with the prior art and has as its objective the provision of a thermal processing method that can prevent the intrusion of a natural oxide layer or the incorporation of impurities such as particles, after one processing step that is either film formation or oxidation/diffusion processing in a combination chamber, and before the other processing is performed.

The present invention relates to a method of thermally processing an object to be processed, using a vertical thermal processing apparatus provided with a reaction tube of a double-wall structure comprising an inner tube and an outer tube, wherein a first gas supply pipe and a second exhaust pipe are provided so as to open into an inner side of the inner tube and a second gas supply pipe and a first exhaust pipe are provided so as to open into a space between the inner tube and the outer tube. This thermal processing method comprises either a first step of using the first gas supply pipe and the first exhaust pipe to make a processing gas flow from the inner side of the inner tube to an outer side thereof, to form a film on a surface of the object to be processed under reduced-pressure conditions, or a second step of using the second gas supply pipe and the second exhaust pipe to make a processing gas flow from the outer side of the inner tube to the inner side thereof, to perform oxidation or diffusion processing on the surface of the object to be processed under normal-pressure conditions, followed by the other of these steps.

With the thermal processing method of the present invention, film formation and either oxidation or diffusion processing can be performed in succession using a common (single) reaction tube, omitting the transfer steps of loading the object to be processed into and out of the reaction tube and conveying it between thermal processing stations between these processing steps. Therefore, the intrusion of, for example, a natural oxide layer and the incorporation of particles between a formed film and an oxide layer can be prevented. When applied to the formation of a multi-layer insulating film consisting of stacked silicon nitride and silicon oxide films for devices such as DRAMs, this method ensures that thin films of extremely good quality are formed, and thus it is also effective for enabling the design of devices with higher levels of integration.

Another objective of the present invention is to provide a vertical thermal processing apparatus that has a high degree of freedom in the choices of processing that can be performed therein, without having to provide a quartz manifold.

The present invention provides a vertical thermal processing apparatus in which a lower portion of a vertical reaction tube thereof is provided with a metal manifold connected to a gas supply pipe and an exhaust pipe, and wherein a large number of objects to be processed are placed in a support device and conveyed into the reaction tube through a lower edge opening of the manifold. The vertical thermal processing apparatus is further provided with a cover of a heat-resistant material arranged so as to shield an inner peripheral surface of the manifold, and inert gas introduction means for introducing an inert gas into a space between the cover and the inner peripheral surface of the manifold.

BRIEF DESCRIPTION OF THE DRAWINGS

FIGS. 3A and 3B are diagrams illustrating the flows of processing gases in the thermal processing method of the first embodiment of the present invention;

FIGS. 4A to 4C are sequential diagrams illustrating a thin film structure obtained by the thermal processing method of the first embodiment of the present invention;

FIG. 5 is a vertical cross-sectional view through a vertical thermal processing apparatus of a second embodiment of the present invention;

DESCRIPTION OF THE PREFERRED EMBODIMENTS

First Embodiment

Figure 1:
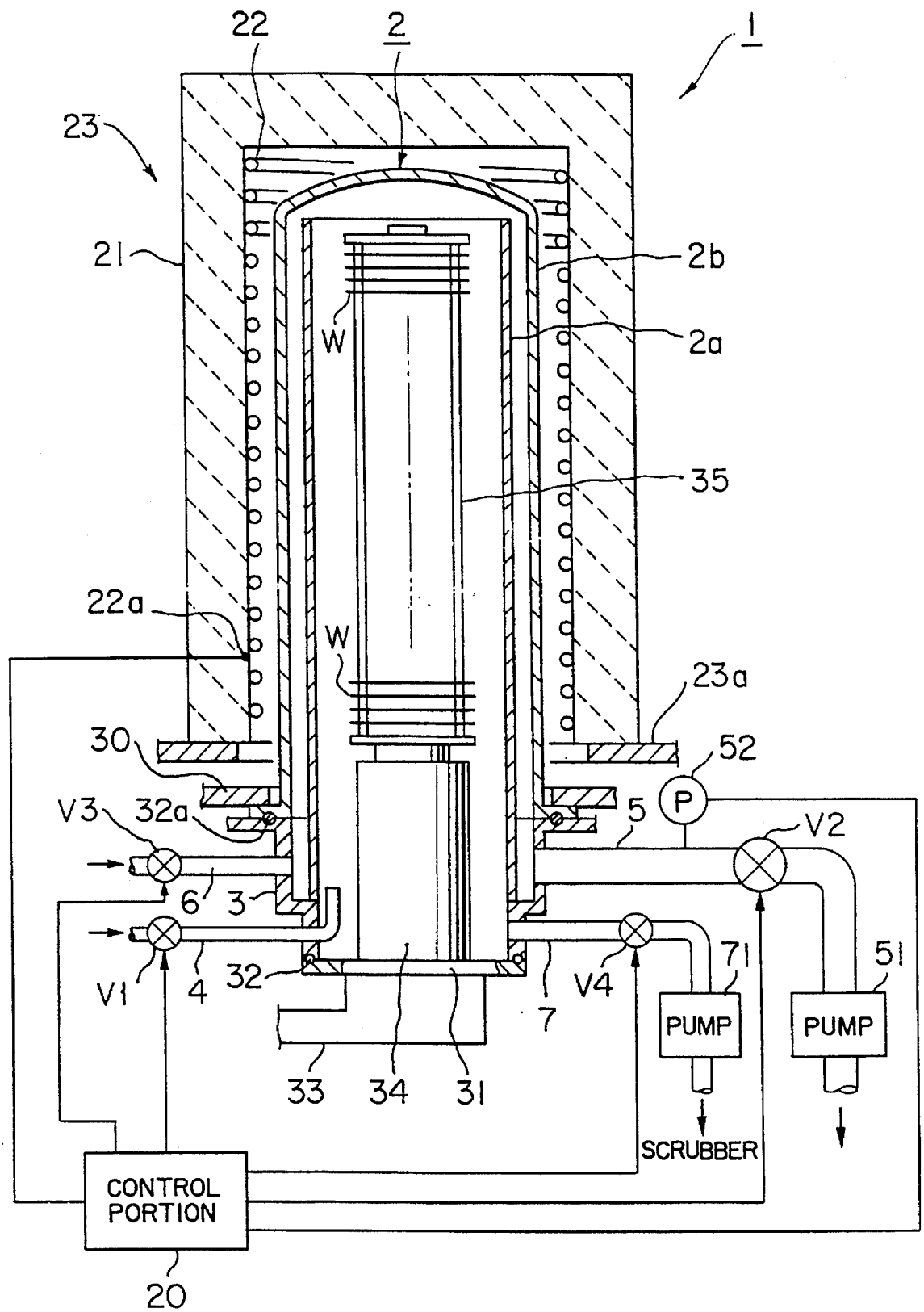
FIG. 1 is a vertical cross-sectional view through a vertical thermal processing apparatus for implementing the thermal processing method in accordance with a first embodiment of the present invention.

An example of a vertical thermal processing apparatus 1 for implementing a thermal processing method of the present invention is shown in FIG. 1. In FIG. 1, reference number 2 denotes a reaction tube that has a double-wall construction comprising an inner tube 2a that is open at both ends, is arranged vertically, and is formed of a heat-resistant material such as quartz, and an outer tube 2b that is arranged in a concentric manner around the inner tube 2a, with a predetermined spacing therebetween, and that has a top covered cylindrical form of a material such as quartz.

On the outer side of the reaction tube 2, a heater chamber 23 configured with a heater 22, which is formed of resistance heating wires on an inner surface of an insulating body 21 supported by a frame 23a, is arranged in such a manner as to surround the reaction tube 2. The reaction tube 2 is held on a manifold 3 that is fixed to a base plate 30 with an O-ring 32a therebetween, and the manifold 3 is configured of stainless steel with a surface thereof that has been subjected to a corrosion-resistant processing such as teflon coating. A cap portion 31 formed of, for example, stainless steel that has been subjected to the same corrosion-resistant processing as the manifold 3 is provided in a lower edge opening portion of the manifold 3 so as to be free to be opened and closed by the raising and lowering of a boat elevator 33. When it is closed, the cap portion 31 hermetically seals the manifold 3 with a O-ring 32 therebetween.

The cap portion 31 is mounted on the boat elevator 33 that is raised and lowered by means such as a ball-screw, and a wafer boat 35 made of a material such as quartz is mounted on top of the cap portion 31 with a heat-insulating tube 34 therebetween. The wafer boat 35 is configured to hold a large number of wafers W, each in a horizontal orientation, in a vertical stack.

At least one first gas supply pipe 4 for supplying a processing gas into a region on the inner side of the inner tube 2a and a first exhaust pipe 5 for evacuating the processing gases from a space between the inner tube 2a and the outer tube 2b are connected hermetically to a side surface of the manifold 3. The first gas supply pipe 4 and first exhaust pipe 5 form a supply piping system that is used for reduced-pressure CVD. An inner end of the first gas supply pipe 4 is, for example, bent in an upward direction, and an output end thereof is connected to a gas supply source that is not shown in the figure, with a valve V1 therebetween. An outer end of the first exhaust pipe 5 is connected to a vacuum pump 51 with a valve V2 therebetween.

A second gas supply pipe 6 for supplying processing gas into the space between the inner tube 2a and the outer tube 2b, separately from the supply piping system used for reduced-pressure CVD, and a second exhaust pipe 7 for evacuating processing gases from a region within the inner tube 2a are also connected hermetically to the side surface of the manifold 3. The second gas supply pipe 6 and second exhaust pipe 7 form a piping system that is used for oxide processing. An outer end of the second gas supply pipe 6 is connected to a gas supply source that is not shown in the figure, with a valve V3 therebetween, and an outer end of the second exhaust pipe 7 is connected to a scrubber that uses water to remove HCl from within the processing gas as dilute hydrochloride acid, with a valve V4 and a separate vacuum pump 71 therebetween.

The gas supply pipes 4 and 6 and the first exhaust pipe 5 are formed of a material such as stainless steel, with the surfaces thereof having been subjected to a corrosion-resistant processing such as teflon coating. The second exhaust pipe 7 is configured of a stainless steel tube provided with an internal sleeve of a heat-resistant material such as quartz.

The above thermal processing apparatus is provided with a control portion 20, where this control portion 20 has the function of controlling the opening and shutting of the valves V1 to V4 on the basis of a predetermined sequencing program and a pressure detected by a pressure gage 52 provided in the first exhaust pipe 5. It also has the function of controlling the power supplied to the heater 22, on the basis of a temperature detected by a temperature detection means 22a.

Figure 2:
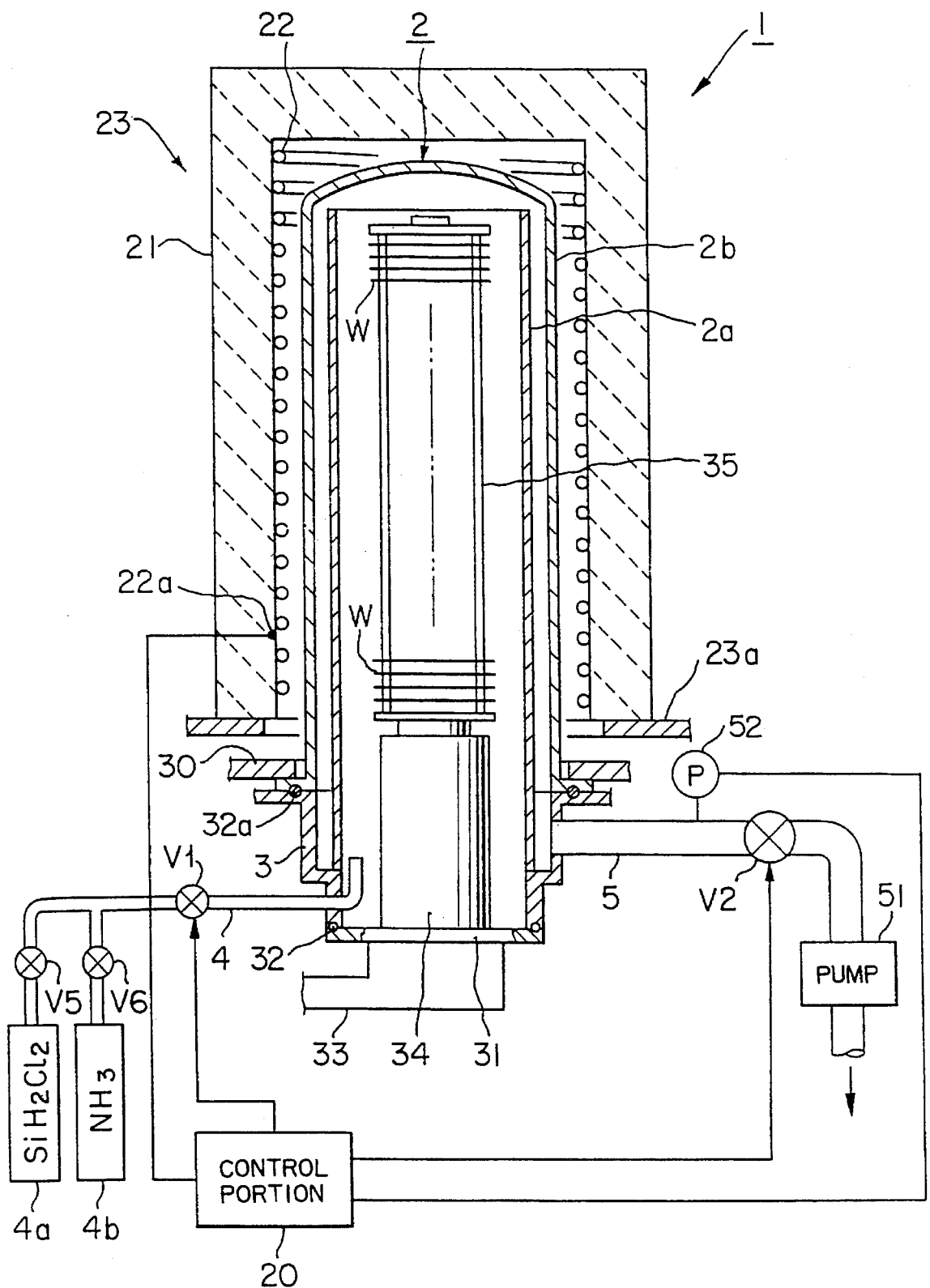
FIG. 2 is a vertical cross-sectional view through a variation of the vertical thermal processing apparatus of FIG. 1.

As shown in FIG. 2, the second gas supply pipe 6 and second exhaust pipe 7 could be omitted, processing gases such as $SiH_2Cl_2$ and $NH_3$ could be supplied separately from processing gas supplies 4a and 4b via valves V5 and V6, and exhaust could be done through the first exhaust pipe 5 alone. In the same manner, the processing gas for the oxidation processing could be supplied in the same direction.

This embodiment of the thermal processing method of the present invention that uses the above described thermal processing apparatus 1 will now be described.

First, the interior of the reaction tube 2 is heated by the heater 22 to a uniform temperature of, for example, 780° C., a number of wafers W, such as 50, that are the objects to be processed are held in a horizontal rack in the wafer boat 35, and the wafer boat 35 is loaded into the reaction tube 2 by the boat elevator 33. The valve V2 is then opened and the interior of the reaction tube 2 is evacuated by the vacuum pump 51 through the first exhaust pipe 5 until it reaches a reduced pressure on the order of $10^{-3}$ Torr, then the valve V1 is opened and processing gases such as ammonia ($NH_3$) and dichlorosilane ($SiH_2Cl_2$) are supplied through the first gas supply pipe 4 into a region within the inner tube 2a at flow rates of, for example, 0.06 liters/minute and 0.02 liters/minute, respectively. While the pressure in the interior of the reaction tube 2 is controlled by the control portion 20 so as to be maintained at a reduced-pressure state of, for example, 1 Torr, the space between the inner tube 2a and the outer tube 2b continues to be evacuated through the first exhaust pipe 5, and layers are formed on the surfaces of the wafers W for a period such as 40 minutes.

The flow of processing gases during the reduced-pressure CVD described above is shown in FIG. 3A, showing how the processing gases are supplied into the interior of the inner tube 2a in order to suppress the generation of layers on the wall portions of the reaction tube 2 caused by the reactions of the processing gases. These gases rise and are evacuated from the outside of the inner tube 2a. By this method, an $Si_3N_4$ layer 82 is formed by the gas-phase reactions of $NH_3$ and $SiH_2Cl_2$ on the surface of a layer such as a polysilicon layer 81, as shown in FIG. 4A and FIG. 4B.

The atmosphere in the reaction tube 2 is then purged with, for example, nitrogen, and also the amount of power supplied to the heater 22 is controlled by the control portion 20 to raise the temperature at a rate of, for example, 50° C./min, so that the temperature within the reaction tube 2 rises to the vicinity of approximately 1000° C. This purging of the interior of the reaction tube 2 with nitrogen is performed by supplying nitrogen into the inner tube 2a from a gas supply pipe which is provided in the manifold 3 in the same manner as, for example, the first gas supply pipe 4, but which is not shown in the figures, while the interior of the inner tube 2a is evacuated by the first exhaust pipe 5. On the basis of control signals from the control portion 20, a valve of the gas supply pipe for nitrogen and the valve V2 of the first exhaust pipe 5 are closed, then the valve V3 of the second gas supply pipe 6 and the valve V4 of the second exhaust pipe 7 are opened so that a mixed gas of, for example, $H_2O$ vapor at a flow rate of 10 liters/minute and HCl at a flow rate of 1 liter/minute is supplied into the space between the inner tube 2a and the outer tube 2b and is also evacuated through the second exhaust pipe 7 from the interior of the inner tube 2a, until the interior of the reaction tube 2 reaches normal pressure.

In this case, the flow of processing gases during this oxidation processing is shown in FIG. 3B. Before the processing gases reach the surfaces of the wafers W, they are supplied into the space between the inner tube 2a and the outer tube 2b in such a manner that they are heated accurately to a predetermined temperature, then they fall and are evacuated from the interior of the inner tube 2a.

In this manner, the surface of the $Si_3N_4$ layer 82 is oxidized to form an $SiO_2$ layer 83, as shown in FIG. 4C. In this case, the HCl fulfills a role of removing impurities from the $SiO_2$ layer 83, but the processing gas could equally well be without HCl, or $O_2$ could be used instead.

In accordance with this embodiment, since the configuration is such that the wafers W are not conveyed out of the reaction tube 2 after the $Si_3N_4$ layer 82 is formed, but the $SiO_2$ layer 83 is formed thereon immediately after the temperature and pressure within the reaction tube 2 have been changed and the processing gases and their directions of flow have been switched, no unwanted oxidation film is formed between the $Si_3N_4$ layer 82 and the $SiO_3$ layer 83, and impurities such as water vapor are not introduced. Further, since the wafers W are not relocated or conveyed into or out of the reaction tube 2 between the different processes, no particles are incorporated therein. Therefore, a good-quality multi-layer isolation film can be obtained, and the above described processing will be extremely effective in satisfying future demands for multi-layer isolation films that are thinner and of higher quality, as the degree of integration of devices increases.

Since a common (single) reaction tube 2 is used for both the film formation and the oxidation processing, the throughput is markedly improved in comparison with the prior art in which separate apparatuses are used for such processes, the space occupied by the equipment can be reduced, and further there is no danger of damage to the wafers W as they are being transferred.

With the above described thermal processing method of the present invention, reduced-pressure CVD processing could be performed after the oxidation processing, or the oxidation and reduced-pressure CVD could be repeated, and this method could also be applied to the formation of other types of film such as an $SiO_2/Si_3N_4/SiO_2$ film. It could similarly be applied to the formation of films that are not multi-layer insulating films, or diffusion processing could be performed instead of the oxidation so that, for example, a phosphorus layer is formed on a surface of polysilicon by CVD using phosphine, then a diffused phosphorus layer is formed by subjecting this phosphorus layer to diffusion processing.

When a halogenated gas such as HCl is used at a high temperature in the vicinity of 1000° C. for a process such as oxidation in the embodiment of the present invention as described above, it is preferable the surface of the stainless steel manifold 3 has been subjected to some form of corrosion-resistance processing, since HCl under such conditions is extremely corrosive. However, the manifold 3 itself, including the intake ports and the exhaust ports, could be made of quartz instead of stainless steel. Note that the piping systems for the film formation and oxidation processings could be used in common within the manifold portion, such as the first gas supply pipe and the second exhaust pipe alone.

Second Embodiment A reaction tube 102 of a vertical thermal processing apparatus (combination chamber) 100 of a second embodiment of the present invention has a double-wall construction comprising an inner tube 102a that is open at both ends, is arranged vertically, and is formed of a heat-resistant material such as quartz, and an outer tube 102b that is arranged in a concentric manner around the inner tube 102a, with a predetermined spacing therebetween, and that has a top-covered cylindrical form of a material such as quartz, as shown in FIG. 5.

On the outer side of the reaction tube 102, a heater chamber 123 configured with a heater 122, which is formed of resistance heating wires on an inner surface of an insulating body 121, is arranged in such a manner as to surround the reaction tube 102. The reaction tube 102 is held on a manifold 103 fixed to a base plate 130, and the manifold 103 is configured of a material such as stainless steel. A cap portion 131 formed of, for example, stainless steel is provided in a lower edge opening portion of the manifold 103 so as to be free to be opened and closed by the raising and lowering of a boat elevator 124. When it is closed, the cap portion 131 hermetically seals the opening portion with a O-ring 131a therebetween.

The cap portion 131 is mounted on the boat elevator 124 that is raised and lowered by means such as a ball-screw, and a wafer boat 126 made of a material such as quartz is mounted on top of the cap portion 131 with a heat-insulating tube 125 therebetween. The wafer boat 126 is designed to hold a large number of wafers W, each in a horizontal orientation, in a vertical stack. Note that a rotational mechanism 128 provided with a rotational shaft 127 is attached to the boat elevator 124, and the heat-insulating tube 125 is mounted on a rotational stand 129 that is rotated by the rotational shaft 127 as shown in FIG. 6.

Figure 6:
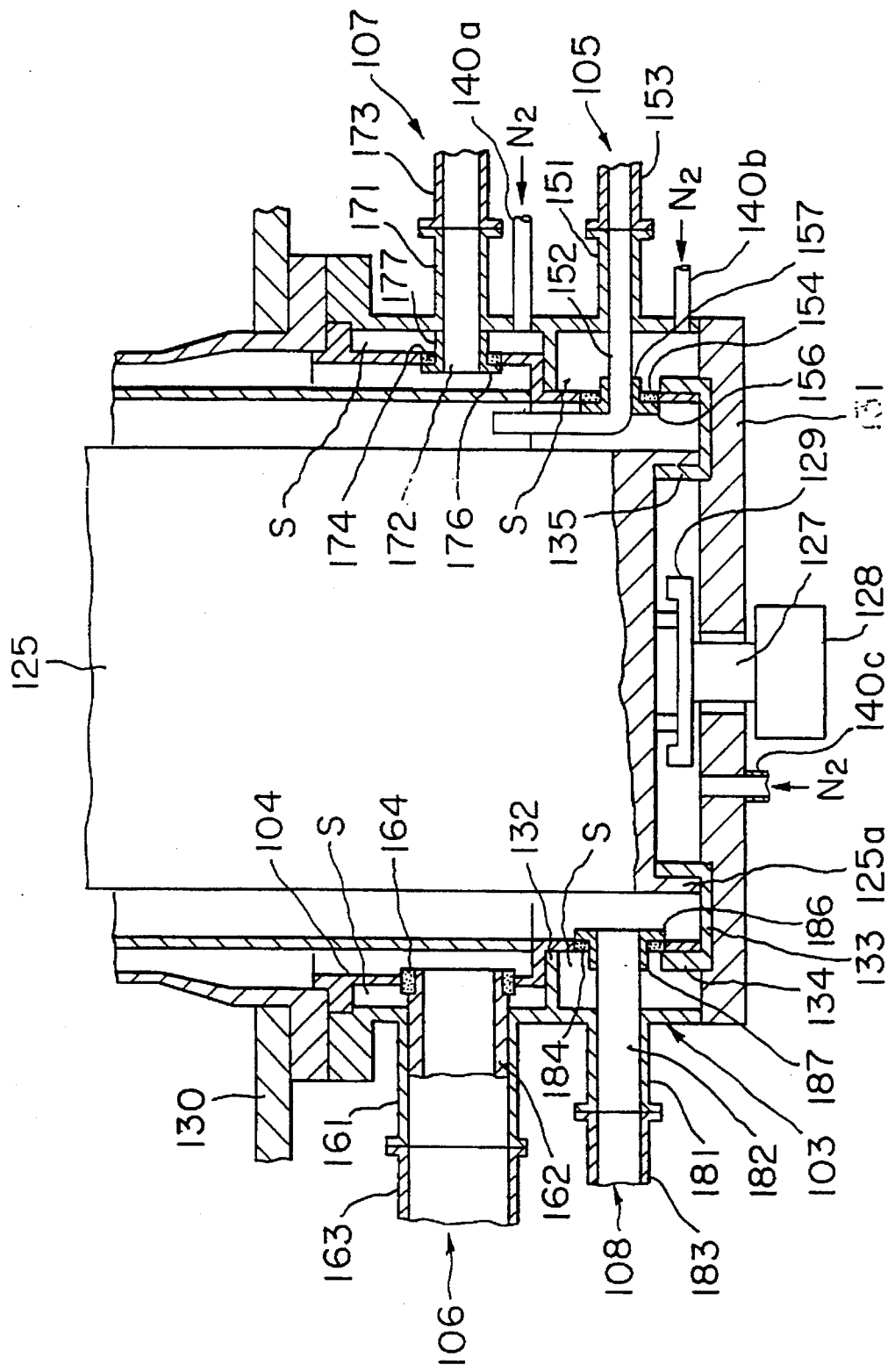
FIG. 6 is a vertical cross-sectional view through essential components of the vertical thermal processing apparatus shown in FIG. 5.

A cover 104 formed of a heat-resistant material such as quartz is provided on an inner side of the manifold 103 in such a manner as to shield the inner peripheral surface of the manifold 103, as shown in FIGS. 5 and 6. This cover 104 is formed in such a manner that an opening at a lower side thereof is smaller than an opening at an upper end thereof, and a stepped portion therebetween is in contact with an annular protrusion 132 formed in the inner peripheral surface of the manifold 103 and also an upper outer edge of the cover 104 engages with an upper inner edge of the manifold 103.

A ring member 133 of a heat-resistant material such as quartz is embedded in a concentric manner with respect to the cap portion 131 in an upper surface of the cap portion 131. An outer edge portion and inner edge portion of the ring member 133 are formed as standing pieces 134 and 135, respectively, that curve upward therefrom (see FIG. 6). A lower edge portion of the cover 104 is supported in such a manner as to be held at a constant spacing (of 0.05 to 0.7 cm) away from the standing piece 134 on the outer edge side of the ring member 133. Similarly, an annular leg portion 125a is formed in a base portion of the heat-insulating tube 125, and the heat-insulating tube 125 is supported in such a manner as to held at a constant spacing (of 0.05 to 0.7 cm) away from the standing piece 135 on the inner edge side of the ring member 133.

A first gas supply pipe 105 for supplying a processing gas into a region on the inner side of the inner tube 102a and a first exhaust pipe 106 for evacuating the processing gases from a space between the inner tube 102a and the outer tube 102b are connected to a side surface of the manifold 103. The first gas supply pipe 105 and first exhaust pipe 106 form a supply piping system that is used for reduced-pressure CVD, and outer ends of the first gas supply pipe 105 and first exhaust pipe 106 are respectively connected to a gas supply source and a pump that are not shown in the figures.

A second gas supply pipe 107 for supplying processing gas into the space between the inner tube 102a and the outer tube 102b, separately from the supply piping system used for reduced-pressure CVD, and a second exhaust pipe 108 for evacuating processing gases from a region within the inner tube 102a are further connected to the side surface of the manifold 103. The second gas supply pipe 107 and second exhaust pipe 108 form a piping system that is used for oxidation processing, and outer ends of the second gas supply pipe 107 and second exhaust pipe 108 are respectively connected to a gas supply source and a pump that are not shown in the figures.

The connective structure between these piping systems and the cover 104 will now be described with reference to FIGS. 6 and 7. Taking as an example the first gas supply pipe 105, an inner end portion thereof extending from an intake port 151 into the manifold 103 is configured of a quartz pipe 152 with an inner end of the quartz pipe 152 being bent upward, and a stainless steel pipe 153 extends from the intake port 151 to the outside.

Figure 7:
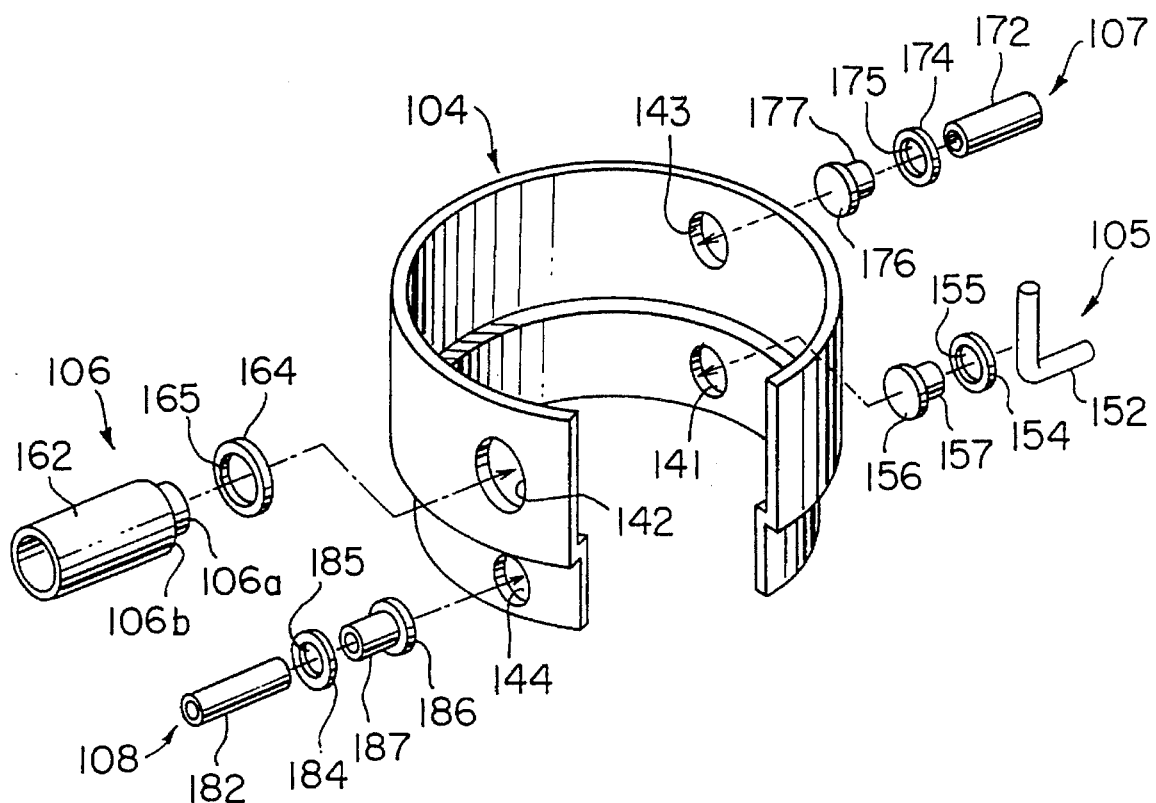
FIG. 7 is an exploded perspective view of essential components of the vertical thermal processing apparatus shown in FIG. 5.

A circular through hole 141 is formed in the side peripheral surface of the cover 104 to correspond with the first gas supply pipe 105 (see FIG. 7), and a quartz plate 154 (in this example, it has an annular shape, as can be seen from FIG. 7) of a shape that conforms with the through hole 141 and is capable of filling the through hole 141 is fitted within this through hole 141 and is welded thereinto. A hole 155 (see FIG. 7) for fitting the piping is formed in the quartz plate 154, a cylindrical plug 157 of quartz that has a flange portion 156 formed on an inner edge side thereof and is of an inner diameter that matches the pipe diameter of the quartz pipe 152 is fitted into the hole 155 in the quartz plate, and also an inner surface of the flange portion 156 is in surface-to-surface contact with the inner surface of the quartz plate 154. The configuration is such that the hole 155 is about 4 mm larger than the outer diameter of the cylindrical plug 157, in order to absorb any axial discrepancy between the manifold 103 and the cover 104. The quartz pipe 152 is inserted in the cylindrical plug 157 so that, in this example, the quartz pipe 152 fits in the hole 155 in the quartz plate 154 for fitting the piping, with the cylindrical plug 157 therebetween.

The second gas supply pipe 107 and exhaust pipe 108 are connected to the cover 104 in a similar manner. In this example, the connective structure for the first exhaust pipe 106 differs from the others in that no cylindrical plug is used. In other words, the pipe wall of an inner end portion of a quartz pipe of the first exhaust pipe 106 is shaved from the outside to reduce the diameter thereof, a reduced diameter portion 106a thereof fits in a through hole 165 in a quartz plate 164, and also a stepped portion 106b thereof is in contact with an inner peripheral surface of the quartz plate 164.

Note that, in FIGS. 6 and 7, reference numbers 142 to 144 denote through holes, reference numbers 161 and 181 denote exhaust ports, reference number 171 denotes an intake port, reference numbers 162, 172, and 182 denote quartz pipes, reference numbers 162, 173, and 183 denote stainless steel pipes, reference number 164, 174, and 184 denote quartz plates welded to the cover 104, reference numbers 165, 175, and 185 denote holes for fitting piping, reference numbers 176 and 186 denote flange portions, and reference number 177 and 187 denote cylindrical plugs formed of quartz.

An inert gas introduction means, such as gas supply pipes 140a and 140b, is connected to upper and lower portions of the manifold 103 to introduce an inert gas such as nitrogen into a space S between the inner periphery of the manifold 103 and the cover 104, in order to prevent the intrusion of processing gases.

Similarly, a gas supply pipe 140c is connected to the cap portion 131 to introduce nitrogen into a space between the cap portion 131 and the heat-insulating tube 125.

The operation of the above second embodiment will now be described. First, the interior of the reaction tube 102 is heated by the heater 122 to a uniform temperature of, for example, 780° C., a number of wafers W, such as 50, that are the objects to be processed are placed in a horizontal rack in the wafer boat 135, and the wafer boat 135 is loaded into the reaction tube 102 by the boat elevator 133. The interior of the reaction tube 102 is then evacuated by the vacuum pump that is not shown in the figures, through the first exhaust pipe 106, until it reaches a reduced pressure on the order of $10^{-3}$ Torr, then processing gases such as ammonia ($NH_3$) and dichlorosilane ($SiH_2Cl_2$) are supplied through the first gas supply pipe 105 into a region within the inner tube 2a at a flow rate of, for example, 0.03 liters/minute.

While the pressure in the interior of the reaction tube 102 is controlled so as to be maintained at a reduced-pressure state of, for example, 1 Torr, the space between the inner tube 102a and the outer tube 102b is evacuated through the first exhaust pipe 106 and $Si_3N_4$ layers are formed on the surfaces of the wafers W for a period such as 40 minutes. During this time, nitrogen is supplied by the gas supply pipes 140a to 140c into the space S between the cover 104 and the manifold 103 and the space between the 10 cap portion 131 and the heat-insulating tube 125, to prevent the intrusion of processing gases into those spaces. These spaces exist because the cover 104 of this second embodiment is placed within the manifold 103 and the heat-insulating tube 125 is placed on the cap portion 131. Some of this nitrogen will flow from these spaces further inward from the cover 104 into the chamber, and some will be sucked from the space between the exhaust port 161 and the quartz pipe 162 of the first exhaust pipe 106, into the stainless steel pipe 163.

The atmosphere in the reaction tube 102 is then purged with, for example, nitrogen, and the temperature within the reaction tube 102 is raised at a rate of, for example, 50° C./min, so that the temperature within the reaction tube 102 is raised to the vicinity of approximately 1000° C. This purging of the interior of the reaction tube 102 with nitrogen is performed by supplying nitrogen into the inner tube 2a from a gas supply pipe which is provided in the manifold 103 in the same manner as, for example, the first gas supply pipe 105, but which is not shown in the figures, while the interior of the inner tube 102a is evacuated by the first exhaust pipe 106.

After this exhaust process is stopped, a mixed gas of, for example, $H_2O$ at a flow rate of 10 liters/minute and HCl at a flow rate of 1 liter/minute is supplied into the space between the inner tube 102a and the outer tube 102b and is also evacuated through the second exhaust pipe 108 from the interior of the inner tube 102a, so that the interior of the reaction tube 102 reaches normal pressure. In this manner, the surface of the $Si_3N_4$ layer is oxidized to form an $SiO_2$ layer. Even during this oxidation process, nitrogen from the gas supply pipes 140 purges the space S.

Since the inner peripheral surface of the manifold is shielded by the quartz cover 104 in accordance with this second embodiment and nitrogen is supplied into the space S between the cover 104 and the manifold 103 to purge it, the manifold 103 is isolated by this nitrogen from the processing gas environment, so that the manifold 103 can be prevented from corroding, even when gases that are highly corrosive at high temperatures are used. Therefore, since corrosion of the manifold 103 is not promoted, even when oxidation processing is performed at temperatures in excess of 1000° C. using oxidation gases that contain HCl, this apparatus can be used for both CVD and oxidation.

If this connective structure is used, in which through holes 141 to 144 are formed in the side peripheral surface of the cover 104, quartz plates 154, 164, 174, and 184 are fitted into these holes, and the above described gas piping (components 105 to 108) is used, the spaces between the gas piping (components 105 to 108) and the cover 104 can be made as small as possible. In addition, since the positional accuracy of the through holes 141 to 144 need not be high, the manufacture thereof is simple. In other words, if the quartz plates 154, 164, 174, and 184 were made integral with the cover 104, it would be extremely difficult to attach the quartz plates 154, 164, 174, and 184 to correspond with the differing vertical and peripheral positions of each of the intake ports and exhaust ports of the manifold 103. However, if, for example, the cylindrical plug 157 is used and the quartz pipe 152 is inserted therein with a certain amount of play, as described above, the jostling between the flange portion 156 and the quartz plate 154 will absorb any positional discrepancy between the intake port or exhaust port and the corresponding through hole, and also the surface contact between the flange portion 156 and the quartz plate 154 can reduce the space therebetween.

With the first exhaust pipe 106, the stepped portion 106b is formed at the inner end of the quartz pipe 162 and that pipe is inserted into the quartz plate 164 with a certain amount of play, so that the jostling between the stepped portion 106b and the quartz plate 164 can absorb positional discrepancy in a similar manner. In such a case, making the diameters of the quartz pipes 152, 162, 172, and 182 slightly smaller than the diameters of the corresponding intake ports and exhaust ports ensures that the above described positional discrepancy can be absorbed sufficiently. Corrosion by processing gases can be suppressed with the cap portion 131 as well, because the space between the heat-insulating tube 125 and the cover 104 is shielded by the ring member 133.

Since the reaction tube 102 is used in common for both the film formation and the oxidation processing, the throughput is markedly improved in comparison with the prior art in which separate apparatuses are used for such processes, the space occupied by the equipment can be reduced, and further there is no danger of damage to the wafers W as they are being transferred. An $SiO_2$ layer can be formed immediately after the $Si_3N_4$ layer is formed, without having to convey the wafers W out of the reaction tube 102, so no unwanted oxidation layer is formed between these layers and impurities such as water vapor are not introduced.

Figure 8:
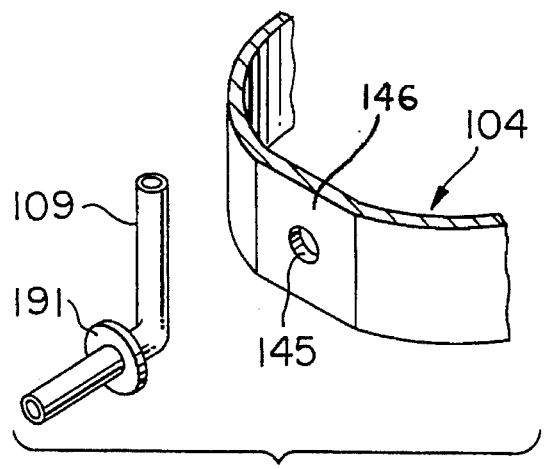
FIG. 8 is an exploded perspective view of some of the essential components of the vertical thermal processing apparatus shown in FIG. 7.

It should be obvious to those skilled in the art that the above described connective structure between the gas piping (components 105 to 108) and the cover 104 is not limited to this embodiment of the present invention; it can also be applied to a structure in which a quartz inner end portion of a gas supply pipe 109 is formed integrally with a quartz flange portion 191, as shown in FIG. 8. The configuration could be such that a flat surface portion 146 is formed around the periphery of a hole 145 for fitting piping that is formed in the cover 104, and an inner end portion of the gas supply pipe 109 is inserted into the hole 145 in such a manner that the flange portion 191 is in surface-to-surface contact with the inner or outer surface of the flat surface portion 146. Note that this configuration could equally well be applied to the attachment of an exhaust port to the manifold. The material of the cover 104 is not limited to quartz, and a gas other than nitrogen could be supplied as the inert gas into the space S between the cover 104 and the manifold 103.

Third Embodiment

When wafers are subjected to a thermal processing in a vertical thermal processing apparatus, first a large number of untreated wafers are placed in a wafer boat, the loaded wafer boat is conveyed into the processing vessel from below by an elevator means, and an opening portion of the processing vessel is closed with a cap portion, as is well known.

In this case, as the wafers are conveyed inward, the outer atmosphere containing particles and oxygen components is also drawn in, and, if the processing is performed without any further treatment, the particles in the atmosphere will generate defects, or the oxygen components will form an unwanted natural oxide layer.

Therefore, after the wafers have been conveyed inward, an inert gas such as nitrogen is blown in from an upper portion of the processing vessel to flush the gases out of the vessel and replace them with nitrogen.

However, although there are some differences between processing vessels, this purging must be performed until the densities of substances such as oxygen, water vapor, and carbides fall below constant levels, such as an oxygen density of 10 ppm or less, and thus such purges usually take 30 to 60 minutes with the nitrogen continuously flowing.

This means that not only is a lot of time required for this purge and thus the throughput drops, but it also causes a problem in that running costs are increased because a large quantity of inert gas is used.

A high-speed, normal-pressure thermal processing apparatus has been specifically developed recently in order to increase throughput by reducing the thermal capacity and also increasing the heater capacity, and thus increase the rate of increase of temperature to approximately 100° C./minute, but there is still a problem in that the above described gas purging creates a bottleneck and requires a lot of time, so that satisfactory results cannot be obtained.

A third embodiment of the present invention is proposed from observation of the above problems, to provide an effective method of solving them. The objective of this aspect of the present invention is to supply a normal-pressure, high-temperature thermal processing apparatus in which a heat-resistant sealing function has been improved in order to enable a vacuum evacuation gas purge, and an atmosphere purging method therefor.

Figure 9:
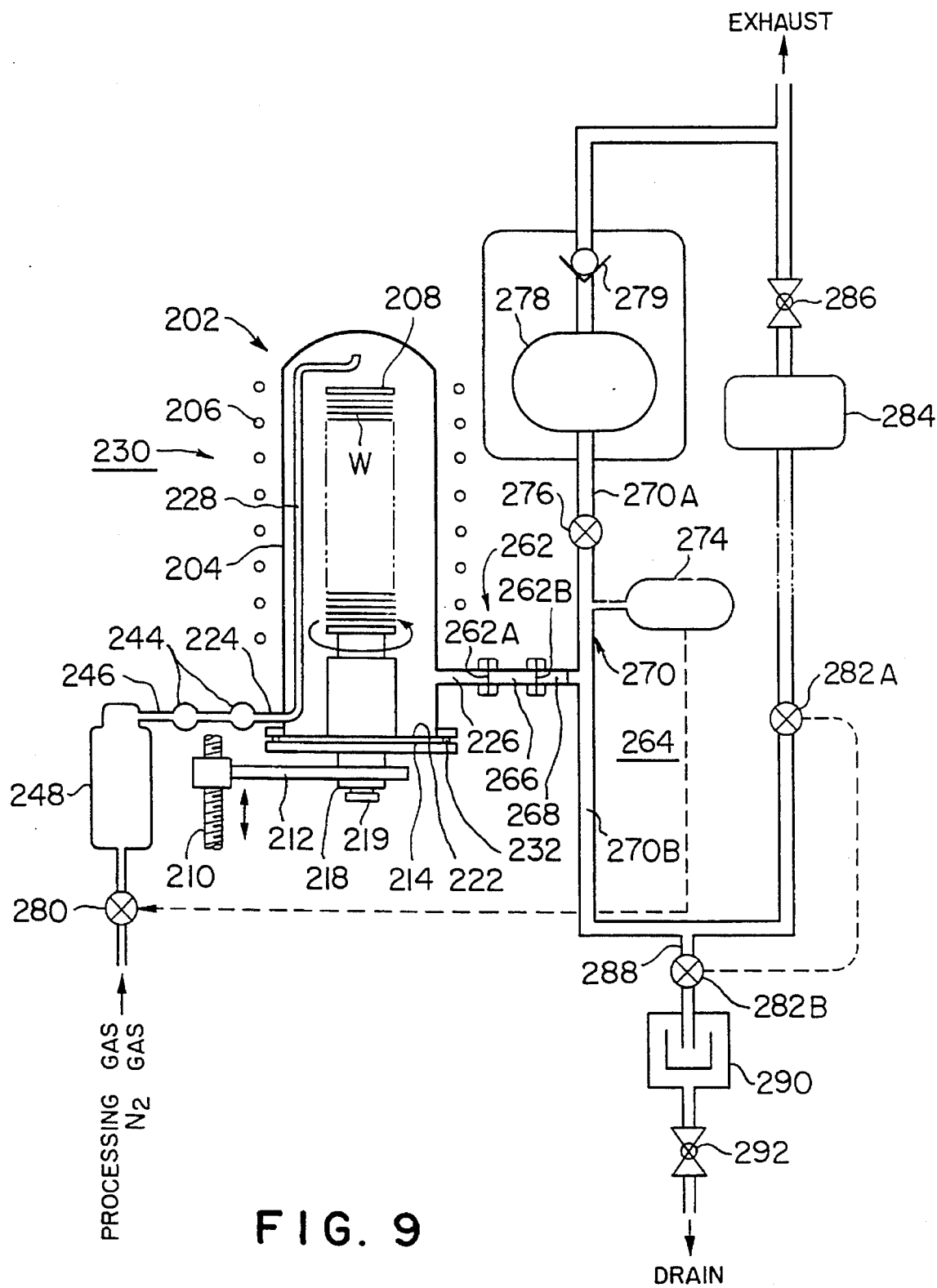
FIG. 9 is a structural diagram of an example of a normal-pressure, high-temperature thermal processing apparatus of a third embodiment of the present invention.

A heater chamber 202 of a normal-pressure, high-temperature thermal processing apparatus (combination chamber) 230 of this third embodiment of the present invention has a processing vessel 204 formed of a corrosion-resistant material such as quartz and having a ceilinged vertical shape with an open lower edge, and a heater such as a resistive heater 206 is provided wrapped around the periphery of the processing vessel 204, as shown in FIG. 9. The processing vessel 204 is mainly configured of a quartz inner tube that is not shown in the figure and an outer tube that is provided in a concentric manner separated by a predetermined spacing from the inner tube.

A boat for holding the objects to be processed (a wafer boat) 208, made of a material such as quartz, is accommodated in the processing vessel 204 in such a manner than it can be inserted into and removed from the processing vessel 204 from below. The wafer boat 208 is configured such that a large number of objects to be processed (semiconductor wafers) W are placed therein at a predetermined pitch in the longitudinal direction thereof.

A stainless steel cap portion 214 mounted on an arm 212 of an elevating means 210 such as an elevator is attached to an open portion at the lower edge of the processing vessel 204 in such as manner that it is capable of opening and closing the open portion, and the wafer boat 208 is mounted on the cap portion 214 with a heat-insulating tube 216 of quartz therebetween.

Figure 10:
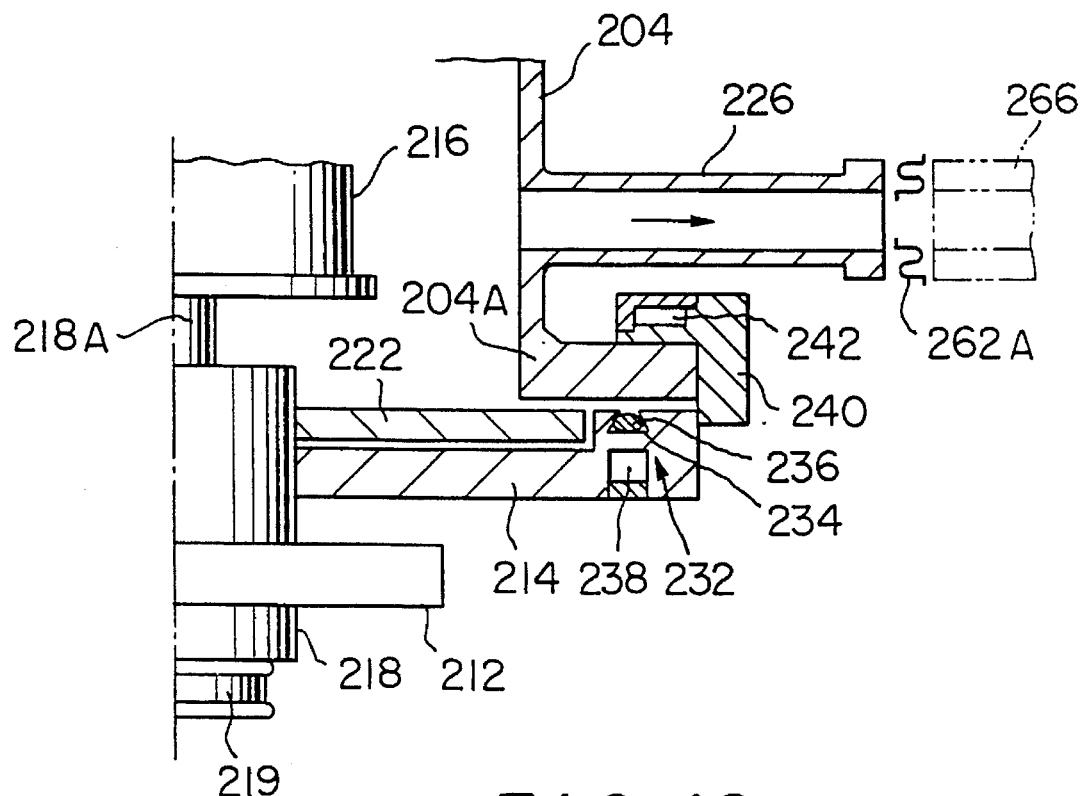
FIG. 10 is an enlarged partial vertical cross-sectional view of a seal structure of a cap portion of the normal-pressure, high-temperature thermal processing apparatus of FIG. 9.

In this case, the wafer boat 208 must be rotated and evenly exposed to the processing gases during the processing, in order to ensure the uniformity of the films formed on the wafers W. For that reason, the cap portion 214 is provided with a rotational shaft 218A supported on a magnetic coupling 218, as shown in FIG. 10, and the configuration is such that the heat-insulating tube 216 is supported on an upper end thereof and is rotated thereby. A pulley 219 is provided on an atmosphere side of the magnetic coupling 218, and a transfer belt from a motor that is not shown in the figures is suspended from he pulley 219. A protective layer 222 of a corrosion-resistant material such as quartz is formed on an upper surface of the stainless steel cap portion 214, in other words on the surface thereof facing the processing vessel 204, to ensure that the cap portion 214 is adequately protected against corrosive gases, even when hydrochloric acid (HCl) is used.

As also shown in FIG. 10, a high-temperature heat-resistant seal means 232 that is capable of withstanding a wafer processing temperature of approximately 1000° C. and a pressure differential with respect to one atmosphere is provided at a connective portion between a lower-edge flange portion 204A of the processing vessel 204 and a peripheral portion of the cap portion 214, to enable vacuum evacuation gas purging and high-temperature processing.

More specifically, the high-temperature heat-resistant seal means 232 is configured such that an annular groove portion 234 is formed around a peripheral portion of the cap portion 214 and an O-ring 236 of a material such as fluorocarbon rubber is arranged therein. Since this O-ring 236 has good sealing properties but inferior thermal resistance, an open annular first coolant passage 238 is formed below the O-ring 236 around the peripheral direction of the processing vessel 204 and an open annular second coolant passage 242 is formed in a holder member 240 that holds the flange portion 204A at the lower edge of the processing vessel 204. The configuration is such that the O-ring 236 can be efficiently cooled by coolant water flowing in these passages 238 and 242.

A gas introduction port 224 for introducing processing gas into the processing vessel 204 and a gas exhaust port 226 for evacuating gases therefrom are formed in a lower edge wall of the processing vessel 204, as shown in FIG. 9, and a gas nozzle 228 that extends upward within the processing vessel 204 is connected to the gas introduction port 224.

Figure 12:
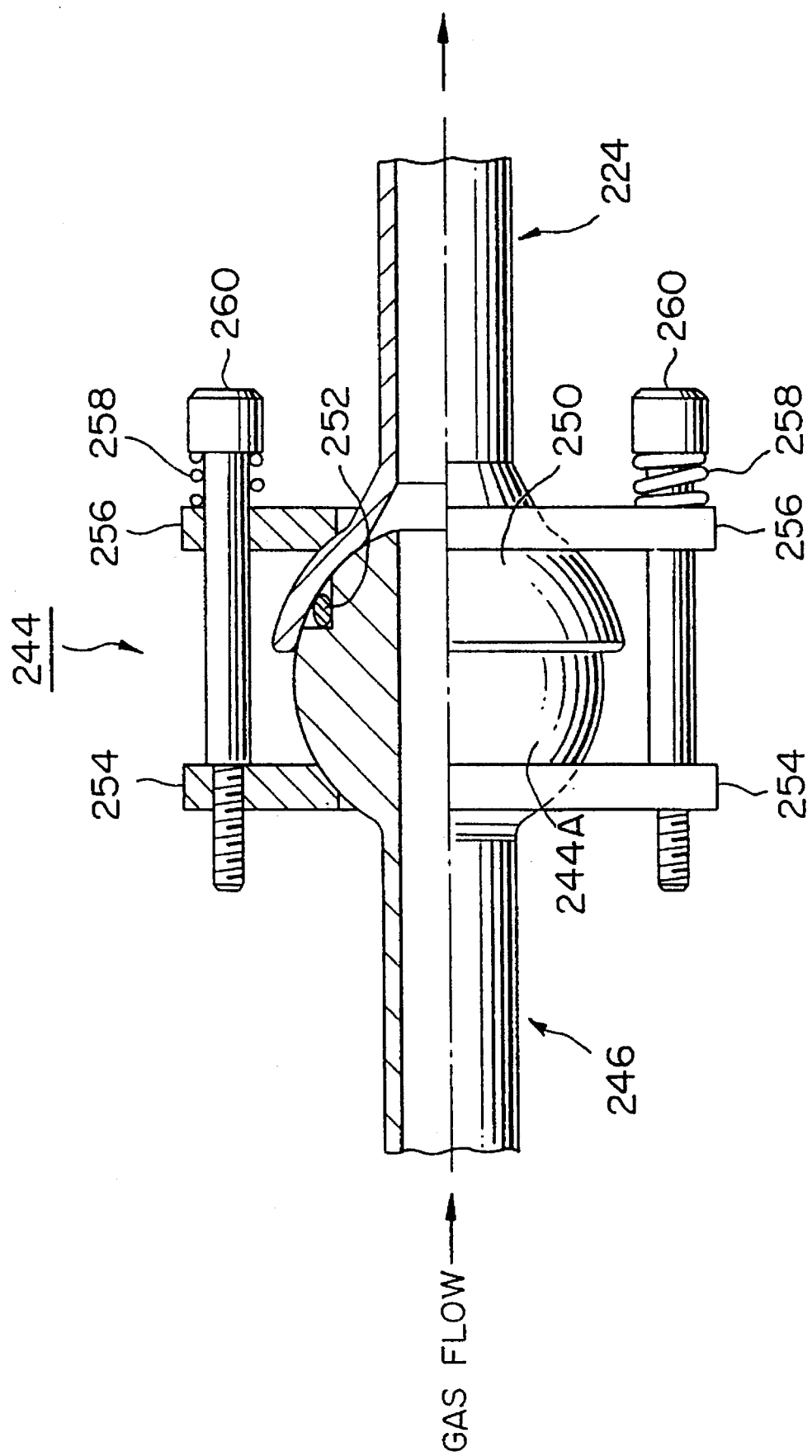
FIG. 12 is an enlargement of a seal structure using a ball joint, for a gas supply system of the normal-pressure, high-temperature thermal processing apparatus of FIG. 9.

A gas supply system 246 is connected to the gas introduction port 224 with a ball joint 244 shown in FIG. 12 therebetween, with the configuration being such that processing gases and an inert gas such as nitrogen, which is required during atmosphere purging, can be supplied thereby.

An external combustion chamber 248 is inserted partway along the gas supply system 246, as shown in FIG. 9, with the configuration being such that steam can be introduced into the processing vessel 204 as required, by burning oxygen and hydrogen therein.

Pipes made of quartz, for example, could be used for the piping of the gas supply system 246, but, in order to ensure complete freedom at installation, the ball joint 244 shown in FIG. 12 could be used in the connective portions thereof. This ball joint 244 is mainly configured of a spherical joint body 244A having a passageway therein, and a cup-shaped receptacle portion 250 that accommodates the joint body 244A. Between these components is interposed an O-ring 252 coated with teflon, which greatly improves the thermal resistance and sealing capability in comparison with an ordinary normal-pressure chamber. The joint body 244A is fixed to a clamping plate 254 and the receptacle portion 250 is fixed to a clamping plate 256. Fixing these clamping plates 254 and 256 together with tightening bolts 260 with springs 258 thereon ensures that the clamping plates 254 and 256 can be tightly connected together with some degree of angular freedom. In the example shown in FIG. 9, two of these ball joints 244 are arranged in series.

In a similar manner, the gas exhaust port 226 is connected to an exhaust system 264 with a second high-temperature heat-resistant seal means 236 therebetween, as shown in FIG. 9. The gas exhaust port 226 is connected to a flexible tube 266 made of a material such as stainless steel, with a metal gasket 262A therebetween as a sealing means. The flexible tube 266 is further connected to a quartz tube 268 with a similar metal gasket 262B therebetween, and the quartz tube 268 is connected to a teflon tube 270.

Figure 11:
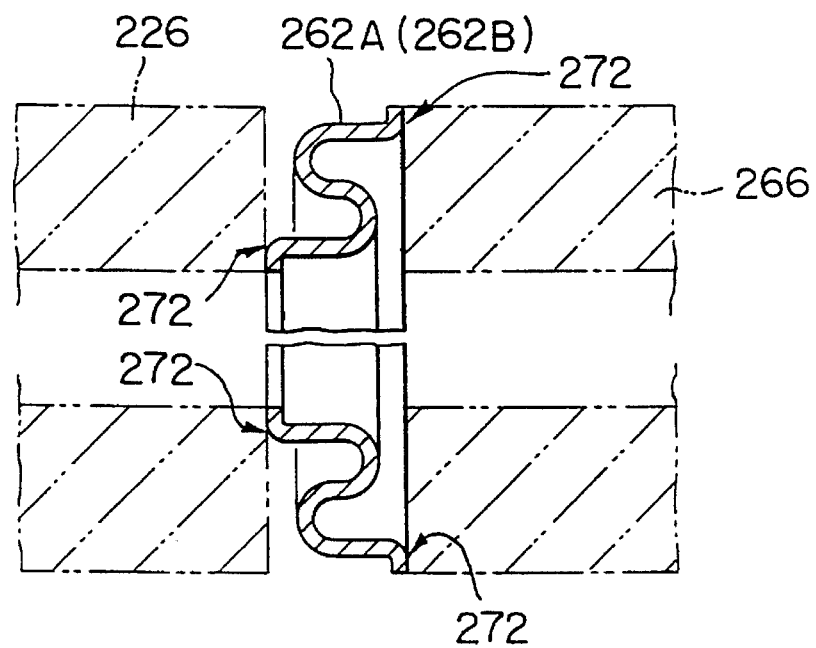
FIG. 11 is an enlarged partial vertical cross-sectional view of a seal structure of an exhaust port and exhaust system of the normal-pressure, high-temperature thermal processing apparatus of FIG. 9.

A cross-section through the metal gasket 262A or 262B is shown enlarged in FIG. 11. Each metal gasket 262A or 262B is formed as an metal ring of a material such as hastelloy that is S-shaped in cross-section, and seal surfaces 272 at each side thereof are forced into pressure contact between the port 226 and the tube 266, or between the tube 266 and the quartz tube 268, with the configuration being such that a good sealing capability is ensured with a low tightening force, and, at the same time, a resistance to high temperatures of the order of 400° C. can be obtained. If fluorocarbon rubber O-rings were used instead of the metal gaskets 262A and 262B, the sealing capability would still be as high, but, since the tightening surfaces are of quartz, it would not be possible to achieve a tightening force that could ensure a sufficient sealing capability.

Note, however, that the configuration could be such that O-rings that ensure a similar sealing capability are provided instead of these metal gaskets 262A and 262B, and also a cooling mechanism such as coolant passages for protecting these O-rings from the heat is provided to ensure resistance to heat.

The teflon tube 270 branches into two systems: a vacuum exhaust system 270A used during gas purging and a normal-pressure exhaust system 270B used during ordinary thermal processing. The vacuum exhaust system 270A is provided with, in sequence, a corrosion-resistant pressure switch 274 that switches on and off a predetermined pressure within the system by a known means, a vacuum-side valve 276, a vacuum pump 278 for gas purging, and a reverse valve 279. The pressure switch 274 is configured to turn on when a normal pressure, such as atmospheric pressure is detected, to close a nitrogen supply valve 280 provided in, for example, a nitrogen introduction pipe, to stop the supply of nitrogen.

The normal-pressure exhaust system 270B is provided with, in sequence, a first normal-pressure-side valve 282A, an exhaust-pressure controller 284, and a manual valve 286, and a downstream side thereof joins with a downstream side of the vacuum exhaust system 270A. The normal-pressure exhaust system 270B branches upstream of the first normal-pressure-side valve 282A to form a drain passage 288. This drain passage 288 is provided with, in sequence, a second normal-pressure-side valve 282B that is operationally linked to the first normal-pressure-side valve 282A, an exhaust-pressure prevention trap 290 for preventing reverse flow, and a manual valve 292, with the configuration being such that drain water within the exhaust system can be removed thereby if necessary.

A gas purging method relating to this third embodiment of the present invention will now be described, with reference to the normal-pressure, high-temperature processing apparatus configured as described above.

Figure 13:
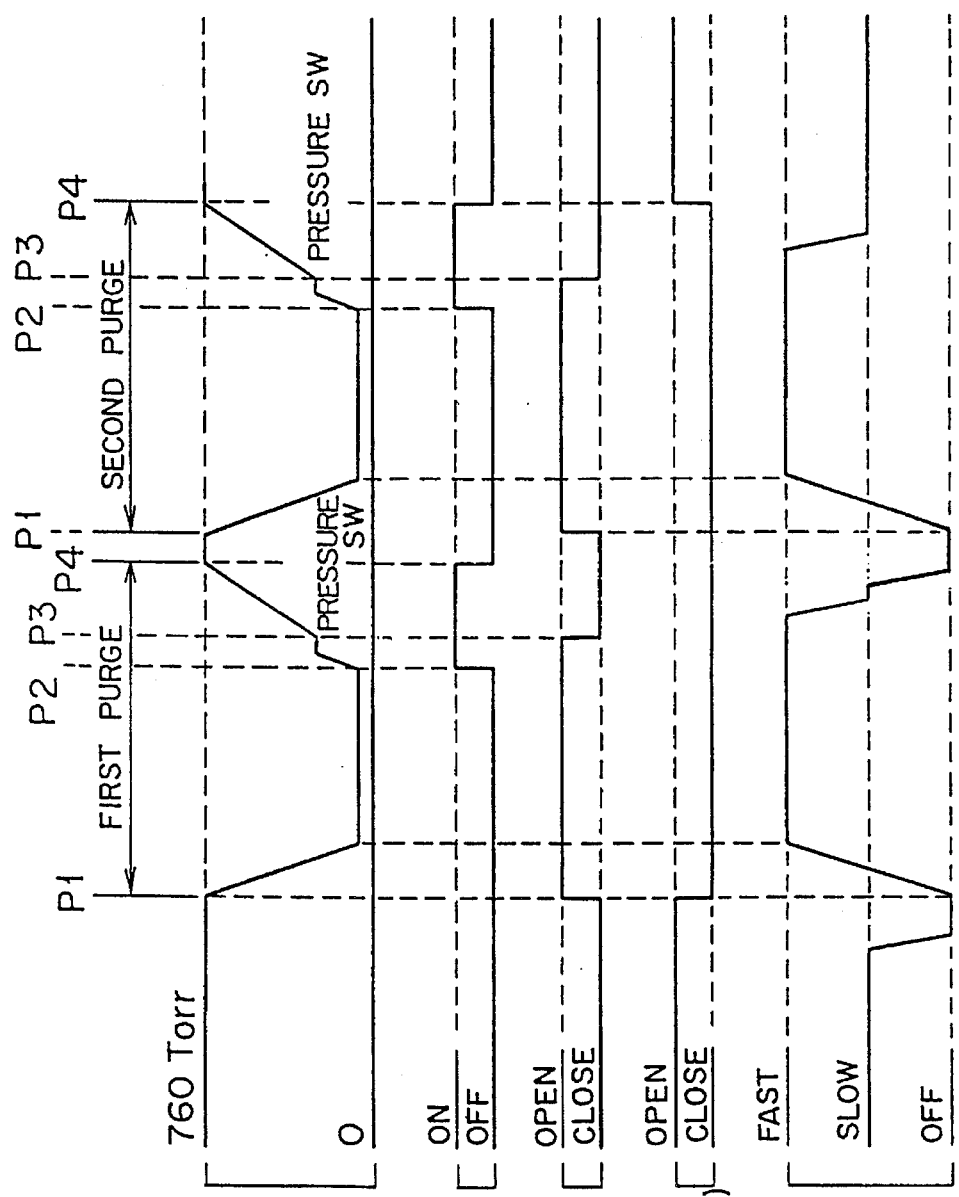
FIG. 13 is a timing chart for gas purging in the normal-pressure, high-temperature thermal processing apparatus of FIG. 9.
Figure 14:
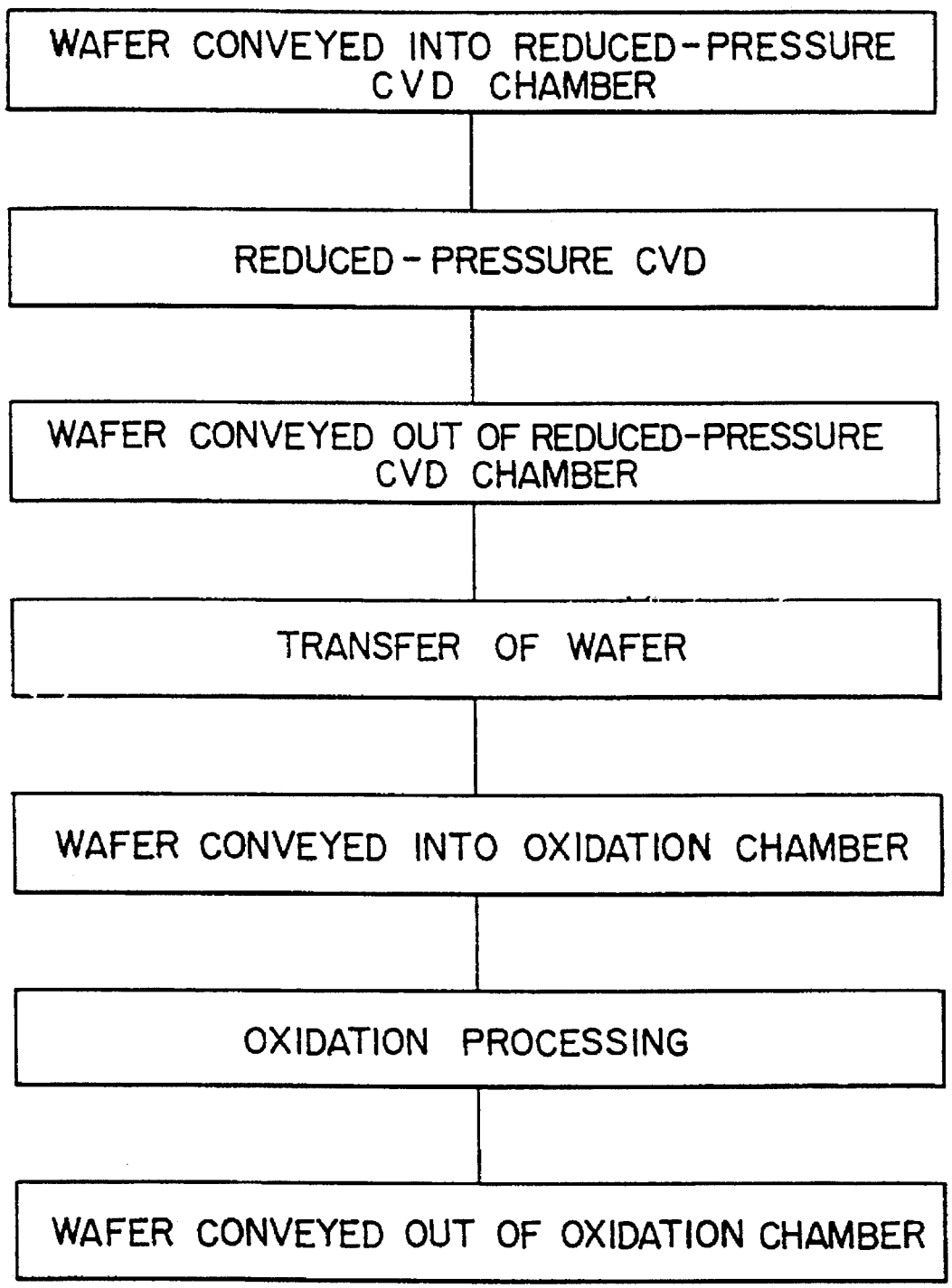
FIG. 14 is a flow chart illustrative of the steps in a prior art thermal processing method.

A timing chart of the operation of purging the gases within the processing vessel is shown in FIG. 13, wherein two gas purges are performed in accordance with this embodiment.

If, for example, the processing temperature is 1000° C., the processing vessel 204 is preheated by the resistive heater 206 of FIG. 9 to a lower temperature, such as 600° C., and the wafers W placed in the wafer boat 208 are loaded into the processing vessel 204. This loading will inevitably draw into the processing vessel 204 some of the air from within the clean room that happens to be between the wafers W. For that reason, gas purging is performed within the processing vessel 204 before the normal-pressure thermal processing, in order to evacuate this drawn-in air to a predetermined level.

Thus the wafer boat 208 containing the large number of wafers W is first raised into the processing vessel 204 by operating the elevating means 210 to load it, then the lower edge opening of the processing vessel 204 is closed by the cap portion 214. At this point, the opening portion is sealed by the high-temperature heat-resistant seal means 232 having the O-ring 236, to form a good air-tight seal.

The nitrogen supply valve 280 and the first and second normal-pressure-side valves 282A and 282B are then closed and the vacuum-side valve 276 of the vacuum exhaust system 270A is opened.

In this status, the vacuum pump 278 for gas purging is operated at a point P1 in FIG. 13, to start the evacuation of the processing vessel 204. In order to prevent the vacuum pump 278 from reducing the pressure too abruptly, its rotational speed is gradually increased over approximately 30 seconds until the pump is running at full speed, as shown at (E) in FIG. 13, to prevent damage to the wafers W that would be caused by a sudden drop in pressure.

The vacuum pump 278 is then run at this speed for approximately 90 seconds until the interior of the processing vessel 204 reaches a high degree of vacuum on the order of 10 to 0.1 Torr and, at a point P, the nitrogen supply valve 280 is opened while the vacuum pump 278 continues to run so that the nitrogen for purging is introduced into the processing vessel 204 and thus the gas purging is performed.

In this case, the cap portion 214 is sealed by the first high-temperature heat-resistant seal means 232 having the O-ring 236. Similarly, the exhaust system 264 is sealed by the second high-temperature heat-resistant seal means 262 using the metal gaskets 262A and 262B. Thus a good seal can be maintained, and the gas purging can be performed efficiently.

After a certain amount of time, such as 15 seconds, the nitrogen flows into the processing vessel 204 and, at a point P3, the vacuum-side valve 276 is shut to stop the vacuum evacuation. At the same time or just slightly afterwards, the rotational speed of the vacuum pump 278 is gradually reduced. The supply of nitrogen continues during this time.

Therefore, the pressure within the processing vessel 204 starts to increase towards normal pressure, and, at a point P4 when it reaches normal pressure, or rather atmospheric pressure, the pressure switch 274 provided in the vacuum exhaust system 270A detects that state, the nitrogen supply valve 280 is closed to stop the supply of nitrogen, and the rotational speed of the vacuum pump 278 drops to zero.

At this point, the gas within the processing vessel 204 is mostly nitrogen, indicating that the gas purging has been done efficiently, and this completes the first gas purge.

The above described operation is then repeated in exactly the same manner, to perform a second gas purge.

Thus, since the interior of the processing vessel 204 has been evacuated and then an inert gas has flowed thereinto, any water vapor, oxygen components, or particles within the processing vessel 204 can be rapidly removed and thus set to below certain levels, and gas purging can be done in a short time.

Although the gas purge was repeated twice in succession in the above embodiment, there is no need to perform it twice if the density of oxygen and other unwanted components can be reduced to below predetermined levels by a single gas purge. Alternatively, if these levels are set very strictly, it may of course be necessary to repeat the purging three or more times.

The reason why the nitrogen is supplied between points P2 and P3, while the vacuum pump 278 is still running to evacuate the processing vessel 204, is described below. No matter how high the sealing capabilities of the second high-temperature heat-resistant seal means 262 that uses the metal gaskets 262A and 262B, a certain amount of the outside atmosphere will leak therethrough, and, if the vacuum pump 278 were to be completely stopped during that time, the leaking atmosphere will flow backwards and enter the processing vessel 204, so that the gas purging efficiency will drop. Leaving the vacuum pump 278 running as described above ensures that any of the outer atmosphere that should happen to flow into the exhaust system 264 is evacuated directly toward the vacuum pump 278 side, without being allowed to flow back into the processing vessel 204.

Once the gas purge has been completed in this manner, the first and second normal-pressure-side valves 282A and 282B are opened and then the normal-pressure exhaust system 270B and the drain passage 288 are opened, to proceed to the ordinary normal-pressure, high-temperature processing.

At the same time, the power supplied to the resistive heater 206 is increased so that the temperature of the processing vessel 204 is increased from 600° C. to the processing temperature of, for example, 1000° C., the gas supply system 246 is opened to supply processing gases, and the ordinary normal-pressure, high-temperature processing is performed.

In this case, components such as the cap portion 214 and gas exhaust port 226 reach fairly high temperatures, but the O-ring 236 of the cap portion 214 is cooled by the flow of coolant water through the second coolant passage 242 and the first coolant passage 238 provided above and below the O-ring 236. This ensures that the sealing is sufficiently maintained without damage to the O-ring 236, and the next vacuum gas purge can be repeated.

In a similar manner, the metal gaskets 262A and 262B provided in the gas exhaust port 226 and the exhaust system 264 are exposed to high temperatures, but their sealing capabilities are not deteriorated, and thus no malfunction will occur during the next vacuum gas purge. The reason why the vacuum-side valve 276 is closed at the point P3 when the pressure within the processing vessel 204 has increased to about 30 Torr, not at the point P2, is to reduce the quantity of outer atmosphere leaking and flowing into the seal portion as the pressure within the processing vessel increases. If there were a leak in the exhaust system, the pressure at that point is preferably as high as possible at 30 Torr, and the vacuum pump is kept running until it reaches near atmospheric pressure, which has the advantage of reducing the amount of leakage.

Once the above described gas purge has been performed, it takes about 6 minutes, 30 seconds to reduce the density of oxygen in the processing vessel 204 from 20% to 10 ppm or less, which can greatly reduce the time required for the gas purge in comparison with a prior art apparatus, enables rapid proceeding to the normal-pressure thermal processing, and thus greatly improves throughput. Note that an apparatus of the prior art configuration would take at least 30 minutes with a flow rate of 20 liters/minute of purging nitrogen to reduce the oxygen density to 10 ppm or less.

In this manner, the implementation of a heat-resistant seal structure in a prior art normal-pressure, high-temperature thermal processing apparatus ensures that the gases within the processing vessel can be forcibly evacuated, so that gas purge can be performed within a short time.

Since this gas purge is completed within such a short time, the quantity of nitrogen that is used can be reduced, and thus running costs can be reduced.

Note that inexpensive nitrogen was used as the inert gas in the above embodiments, but it should be obvious to those skilled in the art that the present invention is not limited thereto; other inert gases could of course be used.

What is claimed is:

1. A vertical thermal processing apparatus that is provided in a lower portion of a vertical reaction tube thereof with a metal manifold connected to a gas supply pipe and an exhaust pipe, and wherein a large number of objects to be processed are placed in a support device and conveyed into said reaction tube through a lower edge opening of said manifold, said vertical thermal processing apparatus comprising:

a cover of a heat-resistant material provided so as to shield an inner peripheral surface of said manifold; and inert gas introduction means for introducing an inert gas into a space between said cover and said inner peripheral surface of said manifold.

2. The vertical thermal processing apparatus of claim 1, wherein said cover is formed of quartz, a piping fitting hole is formed in a side peripheral surface of said cover and a flattened surface portion is formed around the periphery of said piping fitting hole, and an inner end portion of said gas supply pipe or said exhaust pipe is formed of quartz and is fitted into said piping fitting hole.

3. The vertical thermal processing apparatus of claim 2, wherein a cylindrical quartz plug provided with a flange portion is fitted into said piping fitting hole in such a manner that said flange portion is in surface-to-surface contact with either an inner surface or an outer surface of said flattened surface portion around the periphery of said piping fitting hole, and said inner end portion of said gas supply pipe or said exhaust pipe is inserted into said cylindrical plug.

4. The vertical thermal processing apparatus of claim 2, wherein a flange portion of quartz is formed integrally with said inner end portion of said gas supply pipe or said exhaust pipe, and said inner end portion is inserted into said piping fitting hole in such a manner that said flange portion is in surface-to-surface contact with either an inner surface or an outer surface of said flattened surface portion around the periphery of said piping fitting hole.

* * * * *

UNITED STATES PATENT AND TRADEMARK OFFICE
CERTIFICATE OF CORRECTION

PATENT NO. : 5,484,484

DATED : January 16, 1996

INVENTOR(S) : Kenichi Yamaga et al.

It is certified that error appears in the above-identified patent and that said Letters Patent is hereby corrected as shown below:

ON THE TITLE PAGE:

Assignees (Item [73]), please change:

"Assignees:  Tokyo Electron Kabushiki, Japan;

Tokyo Electron Kabushiki Kaisha;

Kabushiki Kaisha Toshiba, Tokyo, all of Japan"

to

--Assignees:  Tokyo Electron Kabushiki Kaisha;

Tokyo Electron Tohoku Kabushiki Kaisha; and

Kabushiki Kaisha Toshiba, all of Japan--.

In column 2, line 5, please change "them" to --then--.

In column 4, line 47, please change "a" to --an--.

In column 4, line 11, please change "Fig. 13 is a timing chart" to --Figs. 13(A) to 13(E) are timing charts--.

UNITED STATES PATENT AND TRADEMARK OFFICE
CERTIFICATE OF CORRECTION

PATENT NO. : 5,484,484

DATED : January 16, 1996

INVENTOR(S) : Kenichi Yamaga et al.

It is certified that error appears in the above-identified patent and that said Letters Patent is hereby corrected as shown below:

In column 9, line 35, please change both occurrences of "wafer boat 135" to —wafer boat 126—.

In column 9, line 36, please change "boat elevator 133" to —boat elevator 124—.

In column 13, line 38, please change "seal means 236" to —seal means 262—.

In column 13, line 47, please change "an" to —a—.

In column 13, line 29, please change "A timing chart" to —Timing charts—.

In column 13, line 30, please change "is shown in Fig. 13" to —are shown in Figures 13(A) to 13(E)—.

In column 13, line 54, please change "Fig. 13," to —Fig. 13(E),—.

UNITED STATES PATENT AND TRADEMARK OFFICE
CERTIFICATE OF CORRECTION

PATENT NO.  : 5,484,484
DATED       : January 16, 1996
INVENTOR(S) : Yamaga, et al It is certified that error appears in the above-indentified patent and that said Letters Patent is hereby corrected as shown below:

In column 13, line 59, please change "at (E) in Fig. 13," to --in Fig. 13(E),--.

In column 14, line 64, please change "point P" to --point P2--.

Signed and Sealed this

Twentieth Day of August, 1996

Attest:

BRUCE LEHMAN

Attesting Officer    Commissioner of Patents and Trademarks